United States Patent [19]

Kowshik et al.

[11] Patent Number: 5,781,471
[45] Date of Patent: Jul. 14, 1998

[54] PMOS NON-VOLATILE LATCH FOR STORAGE OF REDUNDANCY ADDRESSES

[75] Inventors: Vikram Kowshik, San Jose; Andy Teng-Feng Yu, Palo Alto, both of Calif.

[73] Assignee: Programmable Microelectronics Corporation, San Jose, Calif.

[21] Appl. No.: 911,816

[22] Filed: Aug. 15, 1997

[51] Int. Cl.⁶ .................................................. G11C 13/00
[52] U.S. Cl. ............................. 365/185.07; 365/185.18; 365/185.26; 365/185.29; 365/218
[58] Field of Search .................... 365/185.07, 185.18, 365/185.26, 185.29, 218

[56] References Cited

U.S. PATENT DOCUMENTS

| | | | |
|---|---|---|---|
| 4,858,185 | 8/1989 | Kowshik et al. | 365/185.07 |
| 5,097,449 | 3/1992 | Cuevas | 365/185.07 |
| 5,648,930 | 7/1997 | Randazzo | 365/185.07 |
| 5,691,939 | 11/1997 | Chang et al. | 365/185.18 |
| 5,706,227 | 1/1998 | Chang et al. | 365/185.18 |

*Primary Examiner*—Do Hyun Yoo
*Attorney, Agent, or Firm*—Skjerven, Morrill, MacPherson, Franklin & Friel LLP; Tom Chen; Alan H. MacPherson

[57] ABSTRACT

A non-volatile memory latch device includes two PMOS memory cells and a cross-coupled static latch having two PMOS transistors and two NMOS transistors. The floating gates of each PMOS memory cell/transistor pair are coupled together. The control gates of all four PMOS devices are commonly connected to an input. The latch is programmed by applying -3 to -8 volts to the drain of one of the PMOS memory cells, floating the drain of the other PMOS memory cell, and applying 7 to 11 volts to the control gates of all four PMOS devices. The latch is erased by applying 3 to 8 volts to both drains of the PMOS memory cells and -7 to -11 volts to the control gates of all four PMOS devices. Lower programming and erasing voltages are possible with the PMOS latch, as compared with conventional NMOS latches.

5 Claims, 1 Drawing Sheet

PMOS NON-VOLATILE LATCH FOR STORAGE OF REDUNDANCY ADDRESSES

BACKGROUND

1. Field of the Invention

The present invention relates generally to non-volatile latches and specifically to a PMOS based non-volatile memory latch.

2. Description of Related Art

Non-volatile latches can be used to store bits in a variety of semiconductor memory circuits. Conventional non-volatile memory latches, such as one disclosed in U.S. Pat. No. 4,858,185, entitled "Zero Power, Electrically Alterable, Nonvolatile Latch" to Kowshik et. al, incorporate N channel or NMOS memory cells. However, using NMOS memory cells requires high programming and erase voltages, which can limit the size to which the memory cells, and thus the latch, may be reduced. NMOS cells usually have high control gate-to-floating gate capacitance coupling ratios. If the NMOS cells are to be reduced in size, the capacitance coupling ratio must be lowered, thereby requiring even higher programming voltages. The higher programming voltages are incompatible with scaling down the cell size.

For instance, an N channel floating gate EPROM cell is charged by injection of hot electrons from the N channel to the floating gate, accelerated by high voltages on the N+ drain region and on the control gate overlying the floating gate. The cell may be programmed, for example, by applying 12 volts to the control gate and 7 volts to the drain while grounding the source. This electrical bias causes electrons to accelerate across the channel region toward the drain. High energy electrons freed near the N channel/N+ drain junction by the resulting impact ionization are attracted by the more positive control gate voltage and are thus injected through a thin oxide layer into the floating gate to program the cell. Erasing is typically accomplished by discharging the floating gate via electron tunneling. By applying, for example, 15–16 volts to the source while grounding the control gate, electrons in the floating gate are attracted to the more positive voltage at the source, thereby tunneling through the thin oxide layer to the source.

However, charging the floating gate via hot electron injection from the N channel/N+ drain region requires high programming currents and, therefore, results in high power consumption. Further, the EPROM cell may suffer from read disturb and have long term reliability problems as a result of high voltages from the N+ source to the P– substrate during erasing. Moreover, erasing by band-to-band tunneling results in a high erase current, thereby consuming an undesirable amount of power during erasing.

Another type of N channel memory cell, the EEPROM cell may be "erased" by applying 20 volts to the control gate while grounding the source, drain, and substrate. The resultant electric field causes electrons to tunnel from the source, drain, and channel to the floating gate via a thin oxide layer located therebetween, thereby turning "off" the cell. Such a cell can be "programmed", i.e. discharging the floating gate, by grounding the control gate while applying 20 volts to the drain, thereby reversing the electric field and pulling electrons from the floating gate to the drain, which turns "on" the cell. Note that the convention or terminology for "erasing" and "programming" EEPROM cells is commonly reversed from that of EPROMs and flash EEPROMs, which are erased through exposure with ultraviolet light.

The application of such high programming and erasing voltages, which may be, for instance, as high as 20 volts, across PN junctions within the EEPROM cell undesirably limits the amount by which the cell size may be reduced. Additionally, the presence of high voltages, such as 20 volts, on the chip requires a special high voltage processing technology in which thicker field oxides and higher field threshold and other breakdown voltages are required. This introduces process integration and reliability concerns.

Accordingly, a non-volatile memory latch is desired which requires lower programming and erasing voltages, thereby alleviating some of the problems discussed above with respect to conventional NMOS non-volatile latches.

SUMMARY

In one embodiment of the invention, a non-volatile memory latch is comprised of two PMOS memory cells (PC1 and PC2) and a cross-coupled static latch formed from two PMOS memory cells (PC3 and PC4) and two NMOS transistors (MN1 and MN2). The floating gates of memory cells PC1 and PC3 are commonly connected, as are the floating gates of memory cells PC2 and PC4. The control gates of all four PMOS memory cells are commonly connected to an input signal.

In the cross-coupled static latch, the drains of memory cell PC3 and transistor MN1 are commonly connected to the gate of transistor MN2, and the drains of memory cell PC4 and transistor MN2 are commonly connected to the gate of transistor MN1. A supply voltage $V_{dd}$ is commonly connected to the sources of memory cells PC3 and PC4, and the drain of NMOS transistor MN3 is commonly connected to the sources of transistors MN1 and MN2. Transistor MN3 prevents a current flow from $V_{dd}$ to ground when the gate of MN3 is at ground.

To program information in the non-volatile PMOS latch, either node D1 or node D2 is forced to a negative voltage, for instance, in the range of –3 to –8 volts, and the control gates of memory cells PC1 and PC2 are held at a positive voltage, in a range of 7 to 11 volts, for instance. The drain which is not forced to the negative voltage is floated. If node D1 is forced to the negative voltage, electrons are forced into the floating gate of memory cell PC1, thereby programming cell PC1. Similarly, if node D2 is forced negative, memory cell PC2 is programmed. The wells of memory cells PC1 and PC2 are held at approximately 0 volts during the programming mode. Additionally, transistor MN3 is shut off during programming to prevent current drain from $V_{dd}$.

The latch is reset or cleared by forcing the control gates of memory cells PC1 and PC2 to a negative voltage, for example, in a range of –7 to –11 volts, and forcing the drains of memory cells PC1 and PC2 (denoted by nodes D1 and D2, respectively) to a positive voltage, for example, in a range of 3 to 8 volts. This operation forces electrons out of the floating gates of memory cells PC1 and PC2, thereby shutting off memory cells PC1, PC2, PC3 and PC4, i.e., the control gates of PC3 and PC4 become more positively charged thereby shutting off PC3 and PC4. During reset, the wells of memory cells PC1 and PC2 are held at the same positive voltage (3 to 8 volts) as nodes D1 and D2. During reset, transistor MN3 is also shut off to prevent a current path from $V_{dd}$ to ground.

Instead of applying programming or clearing voltages directly to nodes D1 and D2, an input circuit having voltage switches and PMOS and NMOS cells can be used. In such a circuit, an address bit input and a programming enable logic input determine whether the latch is to be programmed or cleared, and if programmed, which of the two memory PMOS memory cells PC1 or PC2 is to be programmed.

Once information is programmed in the latch, the output terminal of the latch, which is at the common drain of memory cell PC4 and transistor MN2, can be used for various applications, such as connection to an input terminal of a comparator circuit for comparing an incoming address bit for redundancy. Such a latch, which uses PMOS memory cells, thus requires lower programming and erasing voltages, thereby allowing the size of the latch to be reduced as compared to conventional NMOS non-volatile latches.

The present invention will be more fully understood in light of the following detailed description taken together with the accompanying drawing.

DETAILED DESCRIPTION

Figure 1:
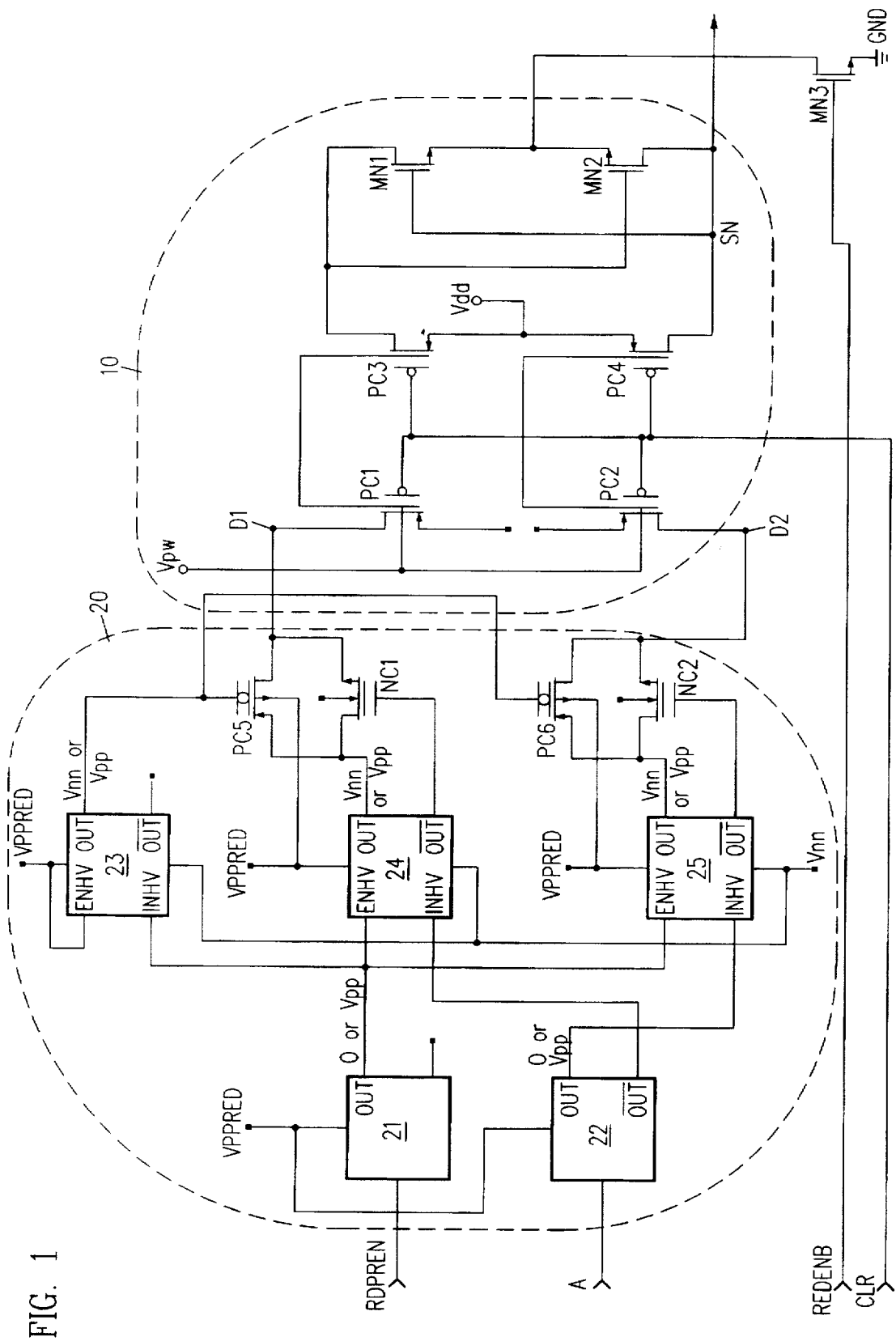
FIG. 1 is a schematic diagram of a PMOS non-volatile latch in accordance with the present invention.

According to one embodiment, a non-volatile memory latch 10, shown in FIG. 1, is comprised of PMOS memory cells PC1 and PC2 and a cross-coupled static latch formed with PMOS memory cells PC3 and PC4 and NMOS transistors MN1 and MN2. By utilizing PMOS memory devices, latch 10 benefits from the advantages of PMOS memories, such as lower programming and erasing voltages. Examples of suitable PMOS memory cells and the advantages therein are described in commonly-owned U.S. patent application Ser. Nos. 08/568,835 entitled "TRIPLE POLY PMOS FLASH MEMORY CELL" filed on Dec. 7, 1995 and bearing Attorney Docket No. M-4592, now U.S. Pat. No. 5,691,939, 08/568,544 entitled "DOUBLE POLY SPLIT GATE PMOS FLASH MEMORY CELL" filed on Dec. 7, 1995 and bearing Attorney Docket No. M-4593, now U.S. Pat. No. 5,706,227, and 08/744,699 entitled "PMOS SINGLE-POLY NON-VOLATILE MEMORY STRUCTURE" filed on Oct. 31, 1996 and bearing Attorney Docket No. M-4268, all of which are incorporated by reference in their entirety.

The floating gate of PMOS memory cell PC1 is common with the floating gate of PMOS memory cell PC3. Similarly, the floating gate of PMOS memory cell PC2 is common with the floating gate of PMOS memory cell PC4. A variable input voltage $V_{pw}$ is applied to the wells of memory cells PC1 and PC2. The control gates of all four PMOS cells PC1, PC2, PC3 and PC4, are commonly connected to an input signal CLR. The gate of transistor MN2 is connected to the common drain of cell PC3 and transistor MN1, while an output terminal of latch 10, sense node SN, is connected to the common drain of cell PC4 and transistor MN2. A supply voltage $V_{dd}$ is connected to the common source of cells PC3 and PC4. The gate of an NMOS transistor MN3 is connected to a logic input signal REDENB (redundancy enable) with the drain of transistor MN3 being connected to the common source of transistors MN1 and MN2. REDENB is set to logic "0" during both programming and erasing to prevent any DC path from $V_{dd}$ to ground by turning off transistor MN3. In non-programming modes, transistor MN3 is on, and the latch formed by cells PC3 and PC4 and transistors MN1 and MN2 is active. The sources of cells PC1 and PC2 are floated. In this configuration, memory cells PC1 and PC2 can be programmed or erased utilizing lower voltages. Once programmed, the information is stored in the latch formed by devices PC3, PC4, MN1 and MN2 in a non-volatile manner.

To program latch 10, electrons are injected from the drain regions into the floating gates of cells PC1 and PC2. For instance, a positive voltage in the range of approximately 7 to 11 volts is applied to the control gates of cells PC1 and PC2, while a negative voltage in the range of approximately −3 to −8 volts is applied to either node D1 or D2, depending on whether cell PC1 or cell PC2, respectively, is to be programmed. If the negative voltage is applied to node D1, node D2 is floated and electrons are forced from the drain region D1 of cell PC1 and tunnel into the floating gate of cell PC1, thereby programming cell PC1 and turning on cell PC3, while simultaneously turning off cell PC2. When cell PC3 is turned on, supply voltage $V_{dd}$ is applied to the gate of transistor MN2, thereby turning on transistor MN2 and pulling the signal on output terminal SN to ground. Similarly, if the negative voltage is applied to node D2 while node D1 is floated, cell PC2 is programmed and cell PC4 is turned on, while cell PC1 is turned off. Supply voltage $V_{dd}$ is then applied directly to output terminal SN.

For the cross-coupled static latch formed by devices PC3, PC4, MN1 and MN2 to function properly, cell PC3 must be on, when cell PC4 is off, and vice versa because supply voltage $V_{dd}$ is connected to cells PC3 and PC4. Thus, according to the operation of cells PC1 and PC2 as described above, cell PC1 is turned on while cell PC2 is turned off and vice versa, thereby allowing the cross-coupled static latch to be fully complementary for both program and read operations.

Latch 10 is cleared or reset by electron tunneling from the floating gates to the N− well, the P+ source, and the P+ drain regions of memory cells PC1 and PC2. This can be accomplished by applying a negative voltage in the range of approximately −7 to −11 volts, for example, to the control gates of cells PC1 and PC2 and by applying a positive voltage in the range of approximately 3 to 8 volts, for example, to the drains of cells PC1 and PC2, denoted by nodes D1 and D2, respectively. The wells of cells PC1 and PC2 are held at this same positive voltage. As a result, electrons are forced out of the floating gate of cell PC1 or PC2 on which such electrons were placed, thereby shutting off cells PC1, PC2, PC3, and PC4 and erasing the latch. Furthermore, the particular one of transistors MN1 and MN2 which was on is turned off as its gate is pulled to ground. Transistor MN3 is forced off during all program and erase modes.

Because latch 10 uses PMOS memory cells, lower programming and erasing voltages (for example, 7 to 11 volts) are possible, as compared to the 20 volts or more required for programming and erasing conventional NMOS memory cells. This lower voltage requirement provides for non-volatile latches that are more readily adaptable to the low voltage operation of a standard logic process as well as ones that are smaller in size than conventional non-volatile latch devices.

In one embodiment, latch 10 can be programmed and erased using a circuit 20 to supply the desired voltages at nodes D1 and D2. Circuit 20 includes two positive high voltage level shifting switches 21 and 22 and three high voltage level shifting switches 23, 24 and 25. Switches 21 and 22 convert input logic signals 0 and 1 to positive high voltage output signals 0 and $V_{pp}$, respectively. When enabled, switches 23–25 translate input voltages 0 and $V_{pp}$ to output voltages $V_{nn}$ and $V_{pp}$, respectively, where $V_{nn}$ is a negative high voltage. Logic input signals RDPREN (Redundancy Program Enable) and A (Address bit) to switches 21 and 22, respectively, determine the voltages supplied to nodes D1 and D2 by circuit 20, and thus determine whether latch 10 is cleared or whether memory cell PC1 or PC2 is programmed.

To program either PMOS memory cell PC1 or PC2, a negative high voltage $V_{nn}$, ranging for example from −3 to −8 volts, is supplied to either node D1 or node D2, respectively, as described above. Using circuit 20, programming is accomplished by setting RDPREN to "1", CLR to a value in the range of approximately 7 to 11 volts, REDENB to "0", and $V_{pw}$ to approximately 0 volts. When input address bit A is at logic "0", cell PC2 is programmed, and when A is at "1", cell PC1 is programmed.

When RDPREN=1, the voltage at output terminal (OUT) of switch 21, which connects to the data input terminal (INHV) of switch 23 and to the enable input terminal (ENHV) of switches 24 and 25, is at $V_{pp}$. The enable input terminal (ENHV) of switch 23 is connected to power supply VPPRED and is thus enabled independent of input signal RDPREN. As a result, switches 23–25 are enabled in the programming mode. Switch 23, whose output terminal (OUT) is connected to the control gates of PMOS cells PC5 and PC6, provides an output voltage $V_{pp}$ to the control gates to turn off PMOS cells PC5 and PC6. The output terminal (OUT) of switch 22 is connected to input terminal (INHV) of switch 25, and the complementary output terminal (OUT) of switch 22 connects to the input terminal (INHV) of switch 24.

Therefore, when A=0, the voltage at input terminal INHV of switch 24 is at $V_{pp}$, resulting in an output voltage of $V_{pp}$, at the output terminal (OUT) of switch 24, which is connected to the source of PMOS cell PC5 and the drain of NMOS cell NC1. Thus, the complementary output terminal (OUT) of switch 24, which connects to the control gate of NMOS cell NC1, carrying a voltage of $V_{nn}$ turns off NMOS cell NC1. Because PMOS cell PC5 is also off, the voltage at node D1 is floated. Also, when A=0, the voltage at input terminal INHV of switch 25 is at 0 volts, resulting in an output voltage of $V_{nn}$ at the output terminal (OUT) of switch 25, which is connected to the source of PMOS cell PC6 and the drain of NMOS cell NC2. Accordingly, the complementary output terminal (OUT) of switch 25, which is connected to the control gate of NMOS cell NC2, provides a voltage of $V_{pp}$ to NMOS cell NC2 to turn on cell NC2. Because PMOS cell PC6 is off and a voltage of $V_{nn}$ is on the drain of NMOS cell NC2, NMOS cell NC2 pulls node D2 to $V_{nn}$ to program cell PC2.

On the other hand, when A=1, the input signal at terminal INHV of switch 24 is at 0 volts, resulting in an output voltage of $V_{nn}$, which places a voltage $V_{nn}$ on the drain of NMOS cell NC1. In addition, with the complementary output voltage of switch 24 being at $V_{pp}$, NMOS cell NC1 is turned on and pulls node D1 to $V_{nn}$ for programming memory cell PC1. When A=1, the voltage at input terminal INHV of switch 25 is at $V_{pp}$, resulting in a complementary output signal of switch 25 being at $V_{nn}$, which turns off NMOS cell NC2 and floats node D2. Thus, suitable voltages can be applied to program latch 10 utilizing circuit 20 by setting RDPREN=1 and setting A=0 or 1, depending on whether memory cell PC2 or PC1 is to be programmed, respectively.

Using circuit 20 to erase or reset latch 10 can be accomplished by setting RDPREN to 0, CLR to a value in the range of approximately −7 to −11 volts, REDENB to 0, and $V_{pw}$ to $V_{pp}$ volts, where $V_{pp}$ is a high positive voltage ranging, for example, from 3 to 8 volts. This provides a high positive voltage $V_{pp}$ to nodes D1 and D2 to clear latch 10, as described above. When RDPREN=0, the output terminal (OUT) from switch 21 is at 0 volts, which disables switches 24 and 25 and provides an input of 0 volts to the data input terminal (INHV) of switch 23. Note that switch 23 is always enabled due to voltage VPPRED. The voltage at output terminal (OUT) of switch 23 is thus $V_{nn}$ which turns on PMOS cells PC5 and PC6. The voltage at output terminal (OUT) of switch 24 and switch 25 is $V_{pp}$ because switches 24 and 25 are disabled, which places a voltage $V_{pp}$ on the source of PMOS cells PC5 and PC6. The complementary output terminal (OUT) of switches 24 and 25 is at a voltage $V_{nn}$, thereby turning off NMOS cells NC1 and NC2. As a result, PMOS cells PC5 and PC6 pull nodes D1 and D2, respectively, to $V_{pp}$, causing latch 10 to be cleared, as described above. Thus, latch 10 can be cleared using circuit 20 by setting RDPREN=1, regardless of the state of address bit A.

Once the information is programmed in the latch, the signal at output terminal SN can be used as for a variety of purposes. For example, if terminal SN is connected to an input terminal of a comparator circuit for redundancy, an output signal of such a circuit might produce a "1" if an incoming address bit matches the bit stored in the latch; otherwise a "0" is output to indicate a mismatch. In addition, the signal at terminal SN can be used as an output to control configuration bit storage or as an input signal to a circuit which allows the latch to be read in a special test mode on a multiplexed line, such as an input/output line.

While particular embodiments of the present invention have been shown and described, it will be obvious to those skilled in the art that changes and modifications may be made without departing from this invention in its broader aspects. Therefore, the appended claims are to encompass within their scope all such changes and modifications as fall within the true spirit and scope of this invention.

We claim:

1. A non-volatile latch comprising:
   a first PMOS memory cell;
   a second PMOS memory cell; and
   a cross-coupled static latch comprising third and fourth PMOS memory celsl and first and second NMOS transistors, wherein the floating gates of said first and third PMOS memory cells are coupled together and the floating gates of said second and fourth PMOS memory cells are coupled together.

2. The non-volatile latch of claim 1, wherein the control gates of said first, second, third and fourth PMOS memory cells are commonly coupled to an input signal.

3. The non-volatile latch of claim 1, wherein said non-volatile latch is programmed or cleared by applying voltages to the drains of said first and second PMOS memory cells and to the control gates of said first, second, third and fourth PMOS memory cells.

4. The non-volatile latch of claim 3, wherein said non-volatile latch is programmed by applying approximately −3 to −8 volts to either the drain of said first PMOS memory cell or the drain of said second PMOS memory cell and by applying approximately 7 to 11 volts to the control gates of said first, second, third and fourth PMOS memory cells.

5. The non-volatile latch of claim 3, wherein said non-volatile latch is erased by applying approximately 3 to 8 volts to the drains of said first and second PMOS memory cells and by applying approximately −7 to −11 volts to the control gates of said first, second, third and fourth PMOS memory cells.

\* \* \* \* \*